United States Patent [19]

Yokoyama

[11] Patent Number: 5,049,055

[45] Date of Patent: Sep. 17, 1991

[54] MOLD ASSEMBLY

[75] Inventor: Takaaki Yokoyama, Niiza, Japan

[73] Assignee: Sanken Electric Co., Ltd., Saitama, Japan

[21] Appl. No.: 512,430

[22] Filed: Apr. 23, 1990

Related U.S. Application Data

[62] Division of Ser. No. 291,065, Dec. 28, 1988, Pat. No. 4,954,357.

[30] Foreign Application Priority Data

Dec. 31, 1987 [JP] Japan .................. 62-336561

[51] Int. Cl.⁵ .................. B29C 45/16; B29C 45/33
[52] U.S. Cl. .................. 425/116; 264/272.15; 264/272.17; 264/275; 425/125; 425/562; 425/577
[58] Field of Search .................. 425/116, 125, 672; 264/272.15, 272.17, 275

[56] References Cited

U.S. PATENT DOCUMENTS

| | | | |
|---|---|---|---|
| 2,559,861 | 7/1951 | Fay | 425/125 |
| 3,549,477 | 12/1970 | Burgman | 264/275 |
| 4,077,760 | 3/1978 | Sauer | 425/562 |
| 4,162,138 | 7/1979 | Byrne | 425/125 |
| 4,377,548 | 3/1983 | Pierpont | 264/272.15 |
| 4,451,973 | 6/1984 | Tateno et al. | 264/272.17 |
| 4,626,185 | 12/1986 | Monnet | 426/116 |
| 4,680,003 | 7/1987 | Schulte et al. | 425/562 |
| 4,723,899 | 2/1988 | Osada | 425/116 |

OTHER PUBLICATIONS

Randolph et al., Plastics Engineering Handbook, Reinhold, N.Y., p. XII, Reliedon (1960).

Primary Examiner—Willard Hoag
Attorney, Agent, or Firm—Bachman & LaPointe

[57] ABSTRACT

Apparatus for manufacturing plastic encapsulated electronic semiconductor devices is disclosed in which a support pad is firmly fixed by slidable means and also by mold halves in molding operation. Slidable means is moved outward of a cavity when it is filled with the plastic encapsulating material to the half volume. Spaces, which are formed after movement of slidable means, are filled with the plastic encapsulating material directly poured through a gate. The encapsulated semiconductor devices indicate excellent thermal radiation and dielectric strength characteristics without formation of voids or unfilled portions in the plastic.

7 Claims, 4 Drawing Sheets

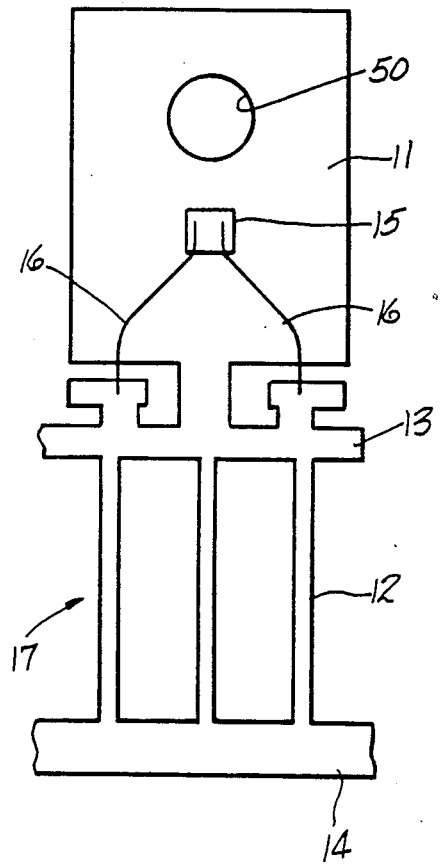
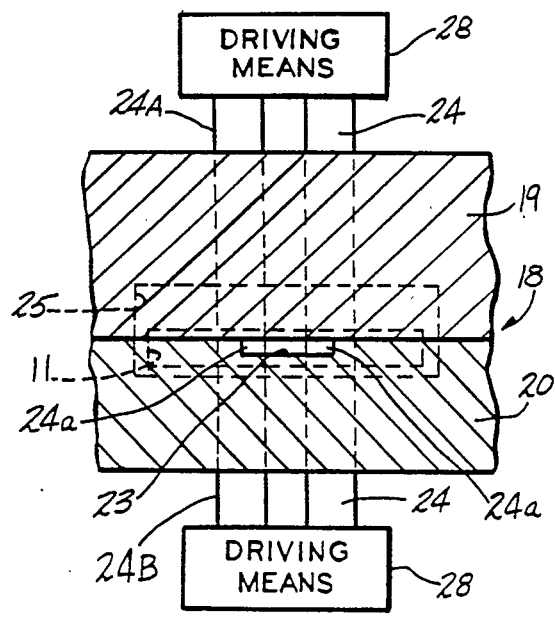
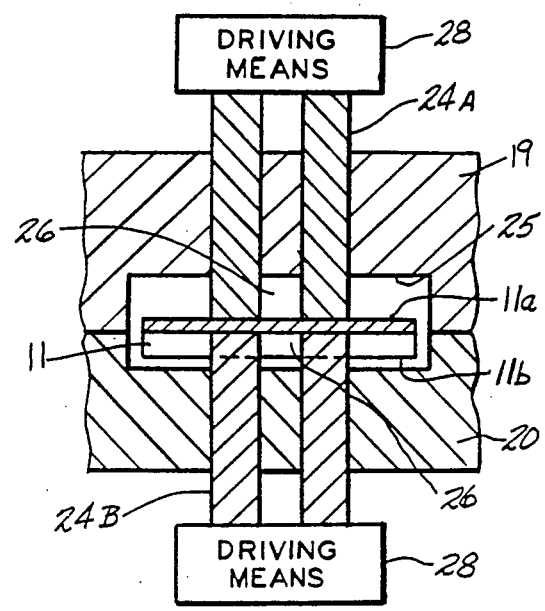

PRIOR ART

MOLD ASSEMBLY

This is a Division of application Ser. No. 291,065 filed Dec. 28, 1988 now U.S. Pat. No. 4,954,357.

BACKGROUND OF THE INVENTION a) Field of the Invention

The present invention relates to packaging of electronic semiconductor devices, especially, a method for manufacturing plastic encapsulated electronic semiconductor devices such as power transistors encapsulated in plastic.

b) Description of the prior art

In general, semiconductor devices require high quality in electric and mechanical characteristics of dielectric strength, durability and thermal radiation, however, it is rather difficult to provide an economical manufacturing process of high quality devices in a practical and available form. In a structural view of electronic devices, packaging of a semiconductor element and a support pad therefor is now very important since the electric and mechanical features in fact depend on the packaged structure of the devices.

Plastic encapsulated semiconductor devices are known some of which include a plastic bottom wall to cover a bottom surface of a support pad on which an electronic element or printed circuit substrate is deposited. For example, a typical semiconductor device of this type is disclosed in U.S. Pat. No. 4,451,973 which sets forth easy encapsulation of semiconductor devices in plastic. In this patent, a power transistor is made by pouring a plastic encapsulating material into a molding cavity wherein a lead frame is placed, and then cutting strips at the small section area connected to bands. Whereas the patent discloses a simple and practical way for manufacture, cut portions of the strips are exposed out of the plastic encapsulating material and therefore apparently results in reduction of dielectric strength, since they may electrically contact or come in close proximity to other objects for short circuit.

In order to avoid such defect, a proposal was made to substantially thoroughly encapsulate the semiconductor chip and support pad except external leads extending out of the plastic encapsulating material, as exhibited by Japanese Patent Disclosure No. 60-130129 published July 11, 1985. It discloses a method of forming a plastic encapsulation by gripping an end of the support pad by means of pins movable in a metallic mold. In this molding technique, there is a clear difficulty in detecting an exact timing for starting travel of pins during the molding operation as mentioned hereinafter in detail. In other words, the molding technique does neither teach any method for fully filling up spaces formed by movement of the pins with plastic encapsulating material, nor any practical way for exactly determining a timing to start travel of the pins. Therefore, in some cases, undesirable holes are formed in the plastic encapsulating material due to delayed movement of the pins during molding operation. Adversely, hasty movement of the pins may cause the support pad to tilt to a slight angle because of injection pressure of the plastic encapsulating material loaded on the support pad, thereby resulting in uneven thickness of a plastic layer formed beneath the bottom surface of the support pad. The plastic layer having the different thicknesses deteriolates quality of the devices due to reduced thermal radiation and cracks in the layer or exposure of the support pad out of the layer.

Meanwhile, many attempt have been made for development of plastic encapsulated semiconductor devices by the inventor of the present invention. As known from Japanese Patent Disclosure No. 61-2348 published Jan. 8, 1986, one of his inventions indicates a mold device which includes a cavity and two gates oppositely provided in both sides of the cavity. In this mold structure, however, the provision of two sets of feed runners and gates complicates the construction and maintenance of the mold.

SUMMARY OF THE INVENTION

It is, therefore, an object of the present invention to provide a method for manufacturing plastic encapsulated semiconductor devices which have coexisting good thermal radiation and high dielectric strength.

Another object of the present invention is to provide a method for manufacturing plastic encapsulated semiconductor devices capable of improving yield in production.

According to the instant invention, a method for manufacturing plastic encapsulated electronic semiconductor devices is provided which comprises the steps of preparing a lead frame assembly and a mold assembly, the lead frame assembly including a plurality of support pads juxtaposed and connected to each other, and external leads which are connected to each one end of the support pads, each of the support pads having a first main surface on which at least an electronic element or a printed circuit substrate is deposited, the mold assembly forming a mold cavity and a gate extending to the cavity, each of the mold cavity having slidable means movable toward and away from the cavity; disposing the lead frame assembly in the mold assembly so that the other end of each support pad is positioned adjacent to the gate; clamping the external leads by mold halves of the mold assembly, and clamping the other end of each support pad by slidable means so that a second main surface of the support pad is in spaced relation to a corresponding surface of the mold cavity; injecting fluid plastic encapsulating material from the gate into the mold cavity; traveling the slidable means away from the support pads which have substantially been fixed by the plastic encapsulating material within the mold cavity; and further injecting plastic encapsulating material from the gate into spaces formed after movement of the slidable means, thereby causing the plastic encapsulating material to encapsulate the electronic element or printed circuit substrate and substantially entire surfaces of the support pad. The slidable means clamps each of the support pads, contacting a side surface of the mold assembly formed with the gate, and narrows a part of the gate upon clamping the support pad. At least, a part of the gate extends below the first main surface of each support pad. The slidable means includes first and second sliders positioned in both sides of the first and second main surfaces of the support pad. The first slider in the side of the first main surface of the support pad has substantially the same width as or larger width than that of the second slider in the side of the second main surface of the support pad. The first slider restricts flow of plastic encapsulating material from the gate into the mold cavity adjacent to the first main surface of the support pad. . The first slider is so positioned above the first main surface of the support pad as to cross an upper extension of the gate. The first slider includes first and second upper slidable members which respectively cross upper extensions of one and the other ends of the gate. The first and second upper slidable members define a passage for flow of the plastic encapsulating material formed therebetween and leading to the gate. Timing for movement of the slidable means is adjusted by travel length of a plunger movable within a pot for the plastic encapsulating material. In fact, the pot may be connected to a plurality of the cavities through runners and gates of substantially same length. Each of the support pads includes a thick portion on which the electronic element or printed circuit substrate is deposited, and a thin portion gripped by the slidable means. The support pad is fixed within the cavity so as to form a smaller distance between the second main surface of the support pad and bottom surface of the cavity than that between the first main surface of the support pad and upper surface of the cavity.

Plastic encapsulating material injected into the cavity serves to securely maintain the support pad in position, and subsequently, slidable means is moved away from the support pad, the tilting of which is prevented by the plastic encapsulating material. In accordance with the present invention, spaces formed after movement of slidable means can be substantially filled up with plastic encapsulating material since slidable means is provided adjacent to the gate. Accordingly, a plastic layer of the uniform thickness may be formed beneath the bottom surface of the support pad without formation of holes in the layer after the movement of slidable means.

The above-mentioned as well as other objects of the present invention will become apparent during the course of the following detailed description and appended claims.

BRIEF DESCRIPTION OF THE DRAWINGS

FIG. 2 is a plan view of the lead frame assembly.

FIGS. 4 and 5 are sectional views respectively taken along lines A 4—4 and 5—5 of FIG. 3.

DETAILED DESCRIPTION OF THE PRIOR ART

Figure 9:
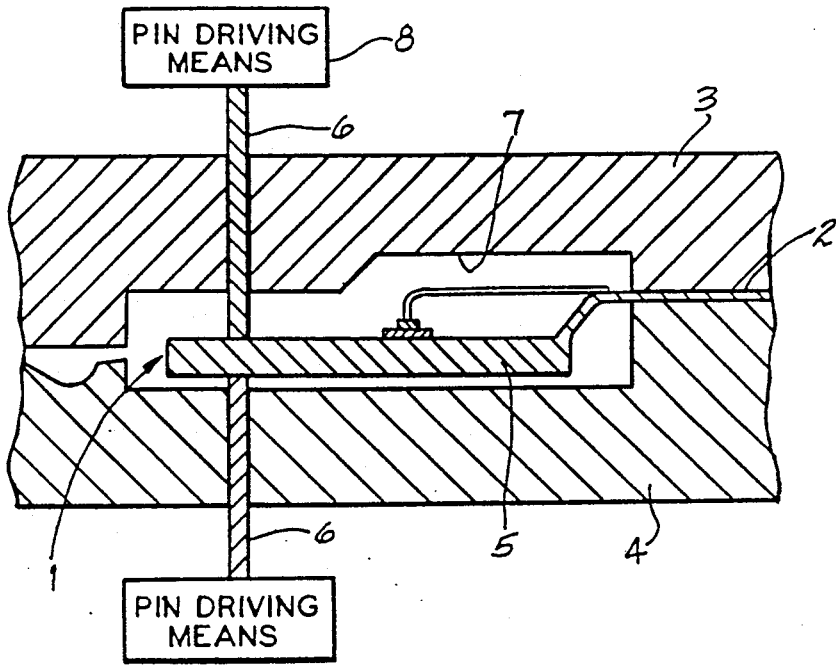
FIG. 9 is a sectional view of a prior art molding machine for manufacturing plastic encapsulated semiconductor devices.

FIG. 9 indicates a sectional view of a mold for carrying out a prior art method. External leads 2 of a lead frame 1 are held between upper and lower mold halves 3 and 4 of the mold, and a support pad 5 is gripped by a pair of pins 6 to fix the support pad 5 in position within a cavity 7, providing an adequate distance between the bottom surface of the support pad 5 and the bottom wall of cavity 7. Then, fluid plastic encapsulating material is injected into cavity 7 under the fixed condition of support pad 5. Subsequently, before the cavity 7 has been filled up with fluid plastic encapsulating material, pins 6 are moved outward of the mold by pin-driving means 8, and fluid plastic encapsulating material is further injected into spaces formed after movement of pins 6. Plastic encapsulated semiconductor devices manufactured in accordance with the above-mentioned method have no exposed metallic portion except external leads 2, and therefore exhibit high dielectric strength and reliability in quality.

However, there is a drawback in prior art methods which can not provide semiconductor devices of good quality in practice. Specifically, if pins 6 are hastily moved outward of the mold before the support pad 5 is fully fixed in position by coagulated plastic encapsulating material, the support pad 5 is carried only by the mold halves in the form of a cantilever. In this condition, fluid plastic encapsulating material is further forced into cavity 7, and then, the support pad 5 intends to tilt under pressure of forced plastic encapsulating material. For that reason, in the produced plastic encapsulated semiconductor devices, a plastic layer formed beneath the bottom surface of support pad 5 does not show a uniform thickness throughout the entire length thereof, thereby resulting in low thermal radiation and weak dielectric strength.

Reversely, in prior art methods, if pins 6 are moved outward of the mold late, plastic encapsulating material around pins 6 has been so coagulated that full amount thereof can not enter the spaces formed after movement of pins 6, thereby these spaces remain as holes or unfilled portions in the plastic layer of the final products. Obviously, this would represent bad appearance of the molding and cause low dielectric strength of the devices. In this way, coexisting good thermal radiation and high dielectric strength can not be obtained in prior art methods for manufacturing plastic encapsulated semiconductor devices.

DETAILED DESCRIPTION OF THE PREFERRED EMBODIMENT

Referring now to the drawings, a lead frame shown in FIG. 2 is provided which comprises a support pad 11, a plurality of external leads 12 formed at one end of the support pad 11, tie bars 13 and 14 connecting the external leads 12 in juxtaposed relation. An actual lead frame includes a plurality of support pads 11 connected in juxtaposed relation to each other for simultaneous production of a plurality of power transistors. While only one support pad 11 is shown in strip form in FIG. 2, there may be as many support pads as desired in the lead frame. Not strictly depicted in the drawings, however, a semiconducting element 15 such as a transistor tip is deposited on an upper surface (a first main surface) of the support pad 11 by solder (not shown), and the semiconducting element 15 is connected by whisker wire leads 16 to the external leads 12 to form an intermediate assembly which is hereinafter called "lead frame assembly 17". Numeral 50 represents a hole for a setting screw formed in support pad 11.

Figure 1:
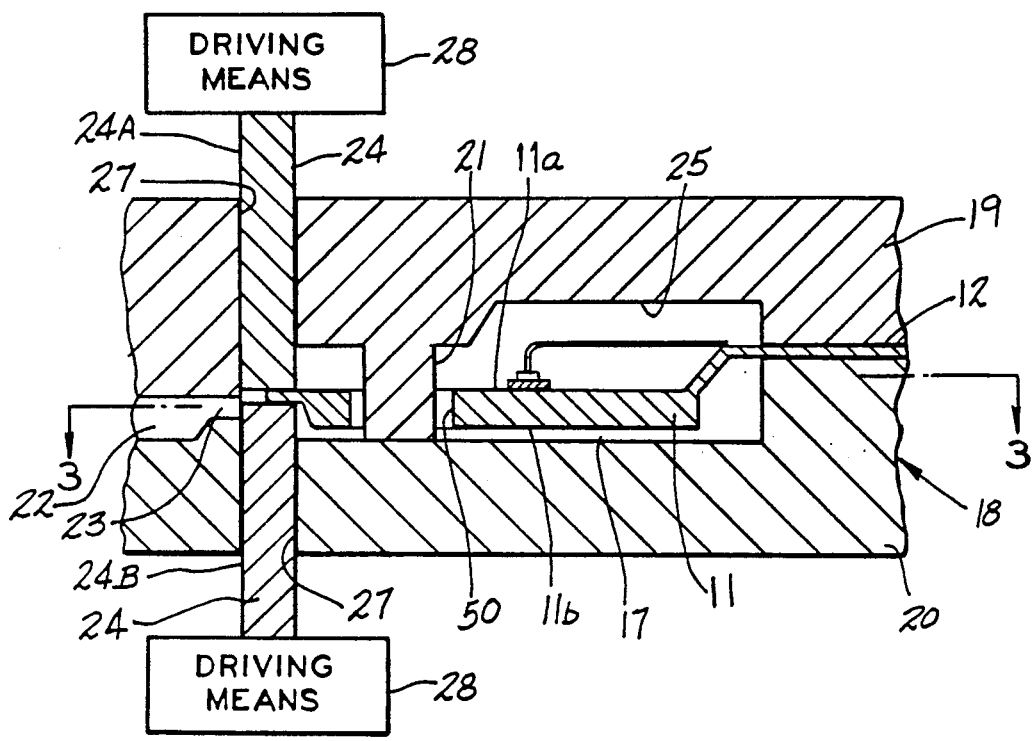
FIG. 1 is a sectional view of a mold in which a lead frame assembly is placed.

Turning now to FIG. 1 illustrating the lead frame assembly 17, it is placed in a metallic mold 18 comprising upper and lower mold halves 19 and 20. The upper mold half 19 is formed with a cylindrical protrusion 21 which extends downward through the hole 50 and comes into contact to the lower mold half 20. Runners 22 and gates 23 (inlets for plastic encapsulating material) are formed at the lower mold half 20. Each of the upper and lower mold halves 19 and 20 is provided with guide passages 27 through which slidable means 24 may be vertically moved toward and away from the lead frame assembly 17 by known driving means 28.

As is apparent from FIG. 1, during the molding operation, external leads 12 are fixed between upper and lower mold halves 19 and 20, and the support pad 11 is gripped by first and second sliders 24A and 24B which constitute the slidable means 24. In this way, the lead frame assembly 17 is so supported within a mold cavity 25 that a bottom surface (a second main surface 11b) of the support pad 11 is held apart from a bottom wall of the cavity 25 by a constant distance (for instance, 0.5 mm) in the spaced relation. At the same time, the protrusion 21 is positioned within the hole 50 in the spaced relation to the inner wall thereof.

Figure 3:
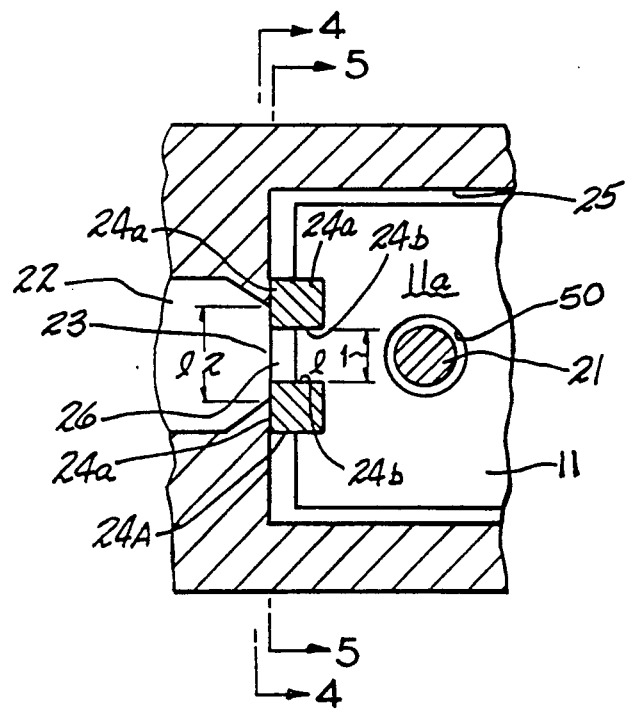
FIG. 3 is a sectional view taken along a line 3—3 of FIG. 1 illustrating a gate portion.

It should be noted that, differently from the prior art method, the slidable means 24 performs two functions in the cavity 25, one is to firmly grasp a thin end portion of the support pad 11 thereby fixing same in position, and the other is to narrow a passage through the gate 23. FIG. 3 represents a sectional view showing the slidable means 24 which grips upper and lower surfaces of the thin end portion of the support pad 11 at two points. Simultaneously, a first side wall 24a of the slidable means 24 is in contact to a side wall of the cavity 25 to narrow the passage through the gate 23. First and second upper slidable members 24A of the slidable means 24 is away from each other in a smaller distance of $l_1$ than width $l_2$ of the gate 23. A similar structure is also applied to first and second lower slidable members 24B of the slidable means 24 as understood from FIG. 5.

FIG. 4 illustrates the clamped condition of the support pad 11 by the slidable means 24 wherein the passage 26 through the gate 23 to cavity 25 is narrowed at both sides 24a of the first and second lower slidable members 24A and 24B of the slidable means 24 so that opening area of the gate 23 is partly closed. Therefore, the passage 26, which has the narrowed width, is defined by both sides 24a of the slidable members 24 adjacent to the support pad 11. However, attention is directed to the mold structure wherein the passage 26 is divided into two ways for upper and lower sides of the support pad 11.

In molding operation, a plastic encapsulating material 29 such as an epoxy resin is injected under pressure through the runner 22, gate 23 and passage 26 into the cavity 25. Since the passage 26 is divided into two ways along the first and second main surfaces 11a and 11b of support pad 11, the plastic encapsulating material 29 is divided into two flows along these ways toward either of upper and lower sides of the support pad 11 for the respective adequate amounts.

Figure 6:
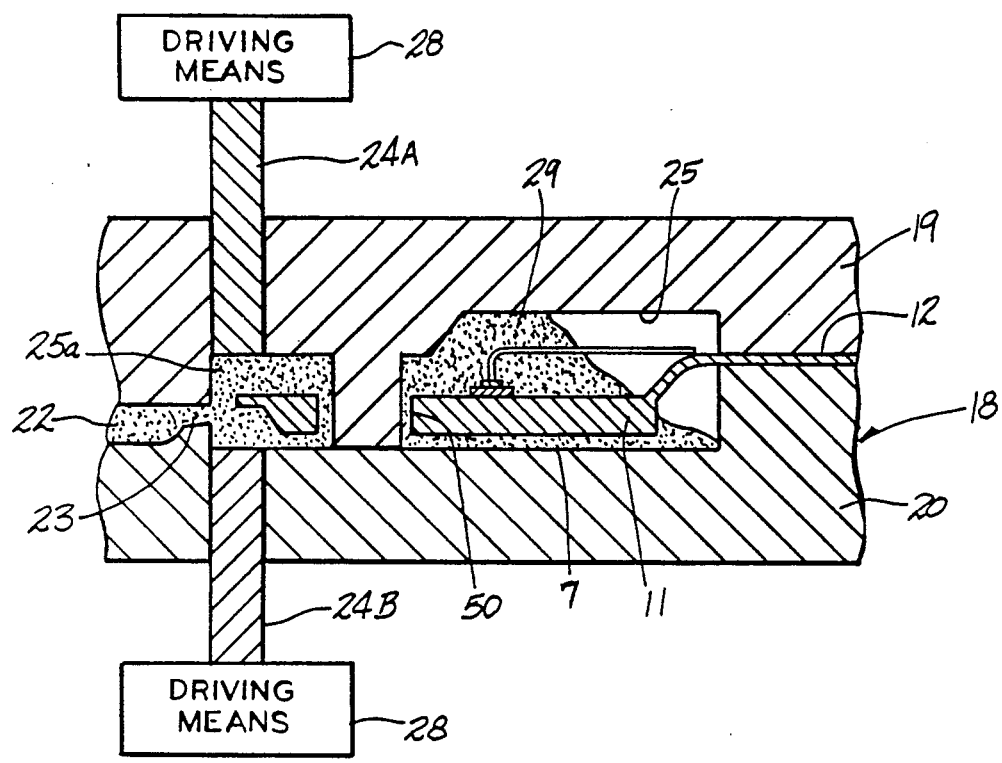
FIG. 6 is a sectional view of the mold after movement of slidable means.

When approximately more than half of entire volume of the cavity 25 is filled with the plastic encapsulating material 29, the slidable means 24 is moved outward of the metallic mold 18 by driving means 28 and therefore the support pad 11 is released from gripping by the slidable means 24. FIG. 6 shows the lead frame assembly 17 in one end supported condition after the support pad 11 is released to the unfixed condition. In this state, however, the support pad 11 does not move or tilt under pressure of injected plastic encapsulating material 29, since it has fully fixed by the plastic encapsulating material 29 already injected into the cavity 25 as shown in FIG. 6, although it is not completely coagulated and still remains liquid. During outward movement of slidable means 24, the plastic encapsulating material 29 is successively injected into the cavity 25. Therefore, the plastic encapsulating material 29 continuously injected through the gate 23 or already injected into the cavity 25, is moved rightward in FIG. 6 under pressure. Each end of slidable means 24, which contacted the thin end portion of the support pad 11, is moved to come flush with and form a part of the inner wall of the cavity 25 as shown. Each end of slidable means 24 is so flat as to provide a flat surface for plastic encapsulating material without formation of stepped portion.

Outward movement of slidable means 24 generates spaces 25a which are parts of the cavity 25 directly connected to the gate 23 through which a full amount of the plastic encapsulating material 29 may be injected into the spaces 25a.

Figure 7:
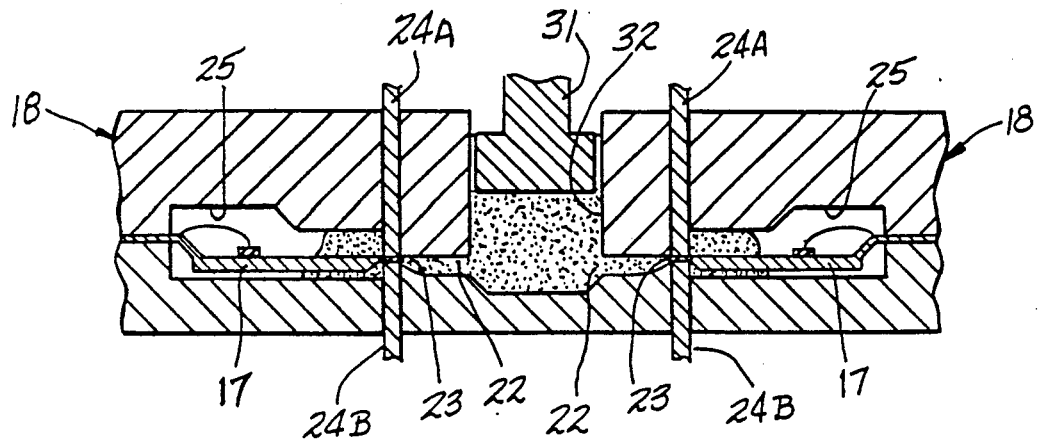
FIG. 7 is a sectional view of the mold having a pair of opposite cavities to which fluid plastic encapsulating material is poured by means of a plunger.

As is apparent from FIG. 7, timing for traveling slidable means 24 is adjusted based on height of a plunger 31. For instance, a pot 32 into which plastic encapsulating material 29 is put, communicates with two cavities 25 through runners 22 and gates 23 for manufacture of two electronic devices at a time. Substantially same length is given for passages through which the plastic encapsulating material flows between each cavity 25 and the pot 32. The length of each passage is represented by length of a runner 22 plus a gate 23. Then, substantially equal amount of the plastic encapsulating material 29 is poured from the pot 32 to the opposite two cavities 25 so that this amount may be determined by travel length of the plunger 32 which is vertically moved along the stroke to push the plastic encapsulating material 29 from the pot 32. Accordingly, when the plunger 32 is lowered to a predetermined level, an approximately half of total volume of the cavity 25 is filled with the plastic encapsulating material 29. At that time, the support pad 11 is securely fixed in position by the plastic encapsulating material 29, and then, movement of slidable means 24 outward of the mold 18 is started.

In the embodiment of the present invention, slidable means 24 is placed in the extended portion of the gate 23. Accordingly, even though the plastic encapsulating material 29 in the cavity 25 is coagulated to a certain degree due to delay of timing in traveling slidable means 24, it can be surely and fully injected into the spaces 25a formed by movement of slidable means 24, since these spaces 25a are directly communicated to the gate 23 as parts of the cavity 25. In this way, even in case of delay in movement of slidable means 24, no hole would be formed in the plastic encapsulating material 29 of the produced electronic devices. In other words, this means that good encapsulation may be provided even in delayed movement of slidable means 24 as well as in timely movement thereof. For that reason, sufficient amount of the plastic encapsulating material 29 can be injected into the cavity 25 without formation of undesirable holes or unfilled portions in the encapsulation. According to the instant invention, after the support pad 11 has been securely fixed by the plastic encapsulating material 29, slidable means 24 may be moved away from the support pad 11, thereby certainly preventing tilting of the support pad 11 by injection pressure of the plastic encapsulating material 29 so that a plastic layer of uniform thickness can be formed beneath the bottom of the support pad 11.

The foregoing embodiment of the invention may be varied in view of actual demands. For instance, other mold structures may be utilized wherein the pot 32 is connected to only a cavity 25, a plurality cavities 25 so as to determine the timing for movement of slidable means 24 from height of the plunger 31. Slidable means 24 may be so placed that side surfaces 24b are flush with, slightly outside or between the surfaces which defines the gate 23. In these cases, a better and desirable practice would require the positioning of the slidable means 24 in an extension of the gate 23 as shown in FIG. 3.

Figure 8:
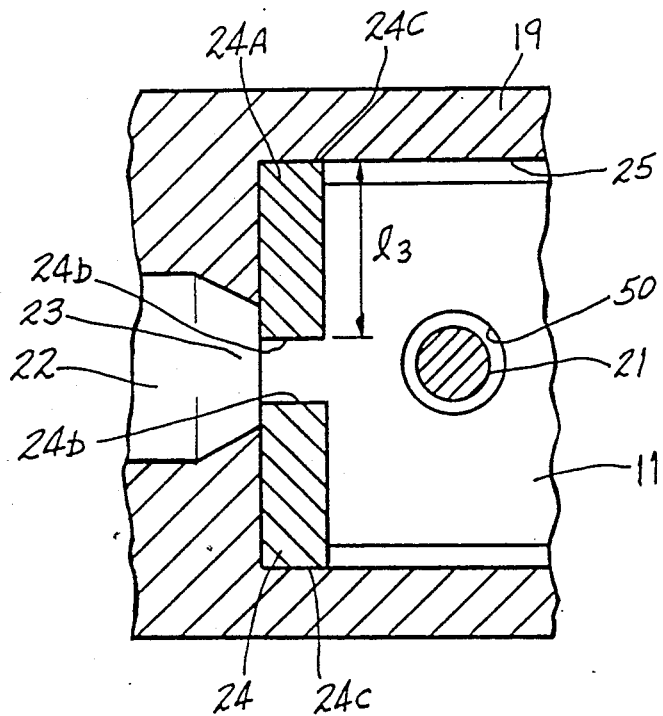
FIG. 8 is a sectional view of another embodiment of the present invention.

FIG. 5 shows substantially the same width of the first and second slidable members 24A and 24B positioned in opposite sides of the first and second main surfaces 11a and 11b of the support pad 11. However, the first slidable members 24A may have larger width than that of the second slidable members 24B. In this connection, as illustrated in FIG. 8, other side surfaces 24c of slidable means 24, which are opposite to the side surfaces 24b, may be extended adjacent to the side walls of the cavity 25, thereby the first slidable members 24A of slidable means 24 having the width of an increased dimension $l_3$ which is larger than that of the second slidable members 24B. The first slidable members 24A of slidable means 24 have lower ends which contact the support pad 11 and suitably control the flow of the plastic encapsulating material 29 above the first main surface 11a of the support pad 11. Adversely, the flow of the plastic encapsulating material 29 below the support pad 11 can be relatively strengthened to sufficiently form a very thin plastic layer. Accordingly, slidable means 24 serves also to balance the flow amounts of the plastic encapsulating material 29 above and below the support pad 11, substantially eliminating voids or unfilled portions.

As above-mentioned, the present invention enables to expand the timing period for movement of slidable means, and thereby provide the method for easy manufacture with high yield of electronic devices having the excellent thermal radiation and dielectric strength.

What is claimed is:

1. Mold assembly for molding plastic material about a preform comprising:
   a first mold half,
   a cooperating second mold half, the mold halves defining a mold cavity therebetween,
   the mold halves defining a gate of a predetermined size providing an entry for plastic material into the mold assembly,
   a first clamp means for clamping one end of said preform,
   a second clamp means for clamping the opposite end of said preform,
   said second clamp means being movably disposed within said mold cavity and being operable to change the predetermined size of said mold gate.

2. The mold assembly of claim 1 wherein the first clamp means defines the mold halves.

3. The mold assembly of claim 1 wherein the second clamp means is disposed immediately adjacent said mold gate.

4. The mold assembly of claim 1 wherein the second clamp means defines a pair of opposed slidable members.

5. The mold assembly of claim 4 including means for driving said slidable members from a first position defining a clamping position to a second position defining an unclamped position.

6. The mold assembly of claim 5 wherein the second clamp means is operable to enlarge the predetermined size of said gate.

7. In a mold assembly including cooperating mold halves, the mold halves defining a mold cavity therebetween, a mold gate, preform and slidable clamp means wherein the preform is clamped at one end by the mold halves and clamped at the opposite end by said slidable clamp means, the improvement comprising:
   the slidable clamp means being disposed immediately adjacent the mold gate so motion of the slidable clamp means is effective to change the size of the gate.

* * * * *